United States Patent [19]

Sigsbee

[11] 4,154,901

[45] May 15, 1979

[54] Nb₃Ge SUPERCONDUCTIVE FILMS GROWN WITH AIR

[75] Inventor: Raymond A. Sigsbee, Schenectady, N.Y.

[73] Assignee: General Electric Company, Schenectady, N.Y.

[21] Appl. No.: 883,717

[22] Filed: Mar. 6, 1978

Related U.S. Application Data

[62] Division of Ser. No. 816,482, Jul. 18, 1977, Pat. No. 4,129,166.

[51] Int. Cl.² .......................................... H01L 39/12
[52] U.S. Cl. ................................. 428/607; 29/599; 75/174; 427/62; 428/660; 428/930
[58] Field of Search ............. 427/62; 75/174; 29/599; 428/606, 607, 660, 930

[56] References Cited

U.S. PATENT DOCUMENTS

| 3,958,327 | 5/1976 | Moroncik et al. | 29/599 |
|---|---|---|---|
| 4,005,990 | 2/1977 | Newkirk et al. | 428/930 |
| 4,043,888 | 8/1977 | Gavaler | 427/62 |
| 4,050,147 | 9/1977 | Winter et al. | 29/599 |
| 4,054,686 | 10/1977 | Newkirk et al. | 427/62 |

FOREIGN PATENT DOCUMENTS

| 2441142 | 3/1976 | Fed. Rep. of Germany | 428/606 |
|---|---|---|---|
| 2542379 | 4/1976 | Fed. Rep. of Germany | 427/62 |

*Primary Examiner*—Arthur J. Steiner
*Attorney, Agent, or Firm*—Jane M. Binkowski; Joseph T. Cohen; Charles T. Watts

[57] ABSTRACT

A superconductive film of Nb₃Ge is produced by providing within a vacuum chamber a heated substrate and sources of niobium and germanium, reducing the pressure within the chamber to a residual pressure no greater than about $10^{-5}$ mm Hg, introducing air into the resulting evacuated chamber in controlled amounts and vaporizing the niobium and germanium to deposit a film of Nb₃Ge on the heated substrate.

6 Claims, 2 Drawing Figures

Nb₃Ge SUPERCONDUCTIVE FILMS GROWN WITH AIR

This is a division, of application Ser. No. 816,482, filed July 18, 1977, now U.S. Pat. No. 4,129,166.

This invention relates to the preparation of Nb₃Ge superconductive films having improved properties.

Thin-film superconductive members are receiving increased attention in the design of high speed, miniaturized computers where the superconductive member, usually in thin film form, is disposed between a pair of terminals. One of the most useful properties of a superconductive film is that it have a high critical temperature $T_c$. As used herein critical temperature $T_c$ is the temperature in degrees Kelvin at which the film becomes 50% superconductive, i.e. the temperature at which it has one half of the normal conductor resistance existing at three degrees Kelvin above $T_c$. Also, as used herein, the transition width, expressed in degrees, is the temperature range over which the film goes from its normal conducting state to the superconducting state, i.e. a transition width of less than one degree Kelvin extends from the temperature in degrees Kelvin at which said film becomes 10% superconducting in that it has 90% of its normal conductor resistance existing at three degrees Kelvin above $T_c$ to the temperature in degrees Kelvin at which said film becomes 90% superconducting in that it has 10% of its normal conductor resistance existing at three degrees Kelvin above $T_c$. The higher the $T_c$ relative to the usual operating temperature, the greater are the electrical properties of the film, i.e. the higher is the current it can carry as well as the magnetic field it can withstand without quenching to the normal state.

In the past, it has not been possible to produce consistently a film of Nb₃Ge composition with a desirable critical temperature $T_c$ and transition width. When by chance such a film has been produced, it has always been produced in an insignificant amount, usually only in short lengths and widths ranging up to about 0.7 centimeter or with surface areas less than 0.5 square centimeter. In contrast to the prior art, the present process allows the consistent production of Nb₃Ge films with a critical temperature $T_c$ of at least 19° K. Also, the present deposited films have a low transition width which is always less than one degree. In addition, the present film can be produced with surface areas which are significantly or substantially larger than that produced by the prior art.

Briefly stated, the present invention is a control method of preparing a superconducting member, which may be composed of a substrate carrying a Nb₃Ge film or it may be the film itself, i.e. a self-supporting film, having a critical temperature $T_c$ of at least 19° K., said critical temperature $T_c$ being the temperature at which said film becomes 50% superconducting in that it has one half of its normal conductor resistance existing at three degrees Kelvin above $T_c$, which comprises providing a vacuum chamber with a substrate having at least one substantially smooth surface on which said film is to be deposited, said substrate being at least substantially inert under the conditions of deposition, providing said chamber with a source of niobium and germanium, means for monitoring of niobium flux and germanium flux individually, providing said chamber with a source of air, protecting said substrate surface with a movable protective means which prevents niobium and germanium flux from contracting it, reducing the pressure in said chamber to produce an evacuated chamber with a residual pressure no greater than about $10^{-5}$ mm Hg, heating said substrate to a temperature ranging from 750° C. to 1100° C., vaporizing said niobium and germanium to produce an impinging flux composition ranging from about 1 part to about 3 parts of niobium to about 1 part of germanium, allowing said residual pressure to stabilize at a level no greater than about $10^{-5}$ mm Hg, introducing into said evacuated chamber a controlled leak of air which raises said stabilized pressure in said chamber at least about $0.1 \times 10^{-5}$ mm Hg, removing said protective means from said substrate, and impinging said substrate with said niobium and germanium composition forming an adherent superconductive Nb₃Ge film thereon ranging in composition up to about 2 atomic % from stoichiometric composition, said film having at least a thickness sufficient to form a continuous film.

Those skilled in the art will gain a further and better understanding of the present invention from the figures accompanying and forming part of the specification, in which.

Figure 1:
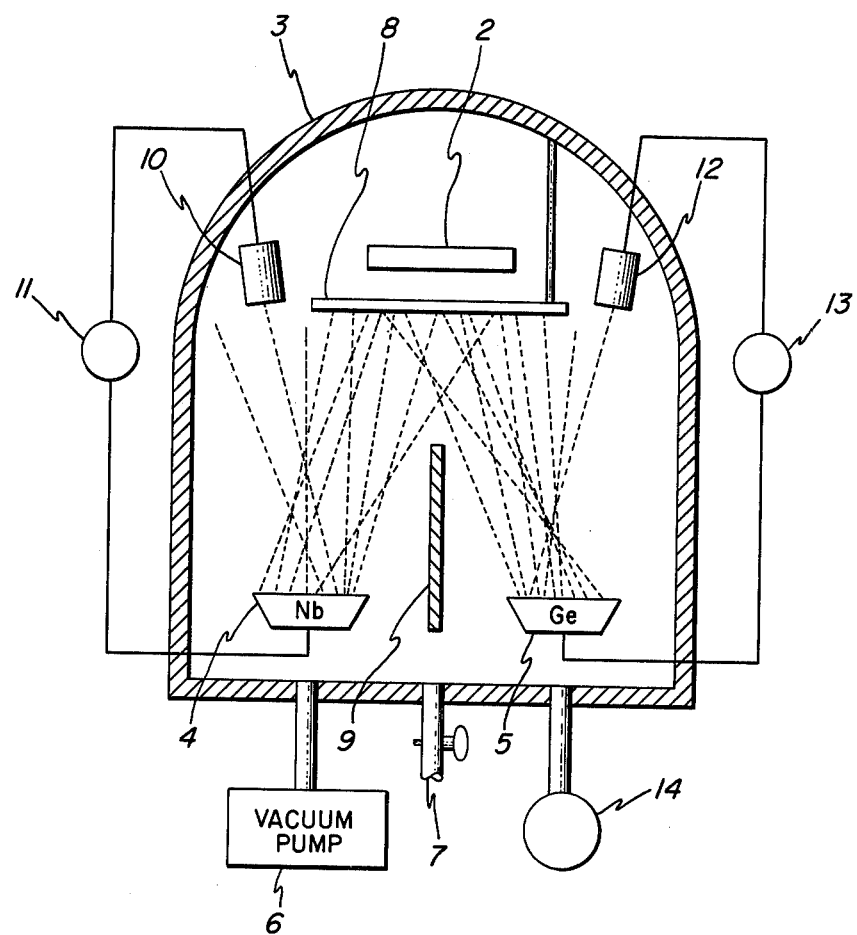
FIG. 1 is a simplified somewhat schematic view of apparatus which can be utilized to carry out the present process.

Shown in FIG. 1 is substrate 2 mounted in vacuum chamber 3. Sources of niobium 4 and germanium 5 are placed within chamber 3 which is also provided with vacuum pump 6 and a source of air 7. A movable protective means 8 is used to protect substrate 2 until niobium and germanium are each vaporized to the levels required for producing the impinging Nb/Ge composition. Partitioning means 9 prevents Ge flux from source 5 from striking monitor 10 and niobium flux from source 4 from striking monitor 12 so that monitor 10 reads niobium flux only and monitor 12 reads germanium flux only. By flux it is meant herein moving species of niobium or germanium vapors emitted from their respective sources. Due to the low pressures of the present process, niobium and germanium flux travel in straight lines and both strike all areas of the substrate surface on which the present film is to be deposited. Monitor 10 is connected to controller 11 and is used to determine the flux level of niobium within the chamber whereas monitor 12 is connected to controller 13 and is used to determine the flux level of germanium within the chamber. Controllers 11 and 13 control the heating power to sources 4 and 5. An electron gun (not shown) is always used to vaporize niobium whereas a number of heating means (not shown) including an electron gun can be used to vaporize germanium 5. Ionization gauge 14 was used to measure the total pressure in chamber 3.

The substrate used in the present process is a solid which is inert or at least substantially inert under the conditions of the present process, i.e. under the conditions of deposition. The size and shape of the substrate is not critical. It can be flexible or rigid depending on the particular desired application. For example, the substrate can be in the form of a tape, foil, wire or plate.

Since niobium is a strong reducing agent, the substrate surface on which it deposits may be reduced by it in a minor amount, but the resulting reacted flayer or product should not be more than about ½ micron in thickness and in such instance, a thicker Nb$_3$Ge film must be deposited to compensate for the niobium lost to the substrate surface Metallic substrates which may diffuse into the present film at elevated temperatures are also useful in the present process provided such diffusion does not degrade the superconductive properties of the film. However, if such diffusion does degrade the superconductive properties of the film, it is preferable to deposit thicker films to insure the presence of Nb$_3$Ge film free of such degrading diffused substrate. Representative of the substrates useful in the present process are sapphire, silicon or oxidized silicon, polycrystalline alumina, niobium, copper, molybdenum, stainless steels and superalloys such as the nickel and/or cobalt-based superalloys.

The substrate surface on which the present film is to be deposited should be smooth or at least substantially smooth, i.e. it should be free or substantially free of abrupt elevational differences. Preferably, the substrate surface used for deposition is mechanically or chemically polished to produce a smooth surface. Before being placed within the vacuum chamber, the substrate should be cleaned of surface impurities, preferably by washing with alcohol or other solvents and detergents and rinsing off with distilled water. After drying, it is placed within the vacuum chamber.

Prior to deposition of the present film, the substrate is heated so that the substrate surface on which the film is to be deposited is maintained at a temperature ranging from 750° C. to 1100° C., and preferably from about 900° C. to 1000° C. Temperatures lower than 750° C. are not operable in the present process whereas temperatures higher than 1100° C. are not practical requiring high power and expensive substrate materials. With increasing impingement rates of niobium and germanium and larger controlled leaks of air correspondingly higher substrate temperatures are necessary. Heating of the substrate can be carried out by a number of conventional means such as radiant heaters or a resistively heated support.

Niobium and germanium, or sources thereof, each contained separately in a boat or crucible are placed within the vacuum chamber. Positioning of the niobium and germanium or sources thereof within the chamber is not critical, but preferably, and as a practical matter, they are positioned close together and substantially equidistant from the substrate in order to have a substantially constant flux composition impinging on the substrate. The evaporation rates of the niobium and germanium are individually monitored with conventional means 10, 11, 12 and 13 such as an ionization gauge type or oscillating quartz crystal type evaporation rate monitors.

In the present process the vacuum chamber is provided with a source of air which can be introduced into the chamber to provide the chamber with a particular incremental pressure of air during deposition of the present film. Such a source of air can be provided in a number of ways such as by a variable leak valve or other means capable of providing a low controlled leak rate into the chamber.

In carrying out the present process, protective means 8 such as a shutter which is easily movable within the chamber by remote control is positioned to protect the substrate from impinging niobium and germanium. Vacuum chamber 3 is then evacuated by conventional means in association therewith such as a vacuum pump 6 so that it has a residual pressure no greater than about $10^{-5}$ mm Hg, and generally such residual pressure ranges from about $10^{-5}$ mm Hg to about $10^{-7}$ mm Hg or lower. The substrate is heated to a temperature ranging from 750° C. to 1100° C. and maintained at this temperature during deposition of the film.

Niobium and germanium are then vaporized. The particular rates of vaporization of niobium and germanium can be controlled by controlling the temperature at which each is vaporized. Niobium and germanium should be vaporized to produce an impinging flux composition on the substrate comprised of about 1 part to about 3 parts of niobium for about 1 part of germanium, i.e. an impinging Nb/Ge flux ratio ranging from 3/1 to 1/1.

The strong gettering ability of evaporating Nb typically drops the system pressure from about $10^{-5}$ to about $10^{-6}$ or $10^{-7}$ mm Hg during the pre-deposition period. When the desired impingement flux composition is reached and when the residual pressure becomes stabilized, i.e. when the residual pressure has dropped and does not fluctuate significantly with further vaporization of Nb, a controlled leak of air is introduced into the chamber. The particular increase in stabilized pressure due to air to be used during the deposition process is determinable empirically, for example, by determining its effect on the critical temperature T$_c$ and composition of the resulting deposited film. Specifically, the operable incremental air pressure range is determined largely by substrate temperature and the impinging rates of Nb and Ge with increasingly larger incremental pressures of air being required by increasing substrate temperature or increasing impingement rates.

Impinging rates of niobium and germanium can be controlled by controlling the temperature of the sources of niobium and germanium, i.e. an increase in temperature increases the rate of vaporization and therefore impinging rate.

Incremental air pressure significantly higher than $5 \times 10^{-4}$ mm Hg is not useful since it is likely to oxidize the deposited film resulting in a significantly deteriorating effect on its properties, whereas incremental air pressure significantly lower than $0.1 \times 10^{-5}$ mm Hg appears not to be effective in producing the present film having a critical temperature T$_c$ of at least about 19° K. and a transition width less than one degree.

Incremental air pressure within the vacuum chamber can be determined by a number of techniques. For example, it can be measured by an ionization type pressure gauge, for example, a Bayard-Alpert type of ionization gauge.

It has been found that not all of the impinging germanium is retained on the substrate, that is, some germanium desorbs from the substrate during the film growth. The factors affecting desorption of germanium from the substrate are substrate temperature, air pressure and the impingement rates of germanium flux and niobium flux on the substrate. The rate at which germanium desorbs from the substrate increases with increase in substrate temperature. Increase in air pressure also increases the rate of germanium desorption from the substrate. On the other hand, increases in the rate of impingement of niobium flux on the substrate decrease the rate at which germanium desorbs from the substrate and increases in the rate of impingement of germanium flux on the substrate decrease the fraction of germanium desorbing from the substrate. Desorption of excess germanium from the substrate by reaction with air and increased solubility of germanium in the Nb$_3$Ge when air is present are believed to be the reasons for the wide niobium to germanium ratios that are operable in the present process.

The factors which most affect film growth in the present process are the niobium/germanium flux ratio impinging on the substrate, i.e. the specific Nb/Ge impinging composition, the impingement rates of niobium and germanium flux on the substrate, substrate temperature and incremental air pressure. An increase in substrate temperature increases the rate of germanium desorption thereby lowering the operable Nb/Ge impinging flux ratio or composition range to less than 3. Specifically, with substrate temperatures higher than 1000° C., more germanium is desorbed from the substrate and the operable niobium/germanium impinging ratio tends to decrease and higher air incremental pressures are required since air constituents will also desorb more readily and more desorbing germanium is available to react with the air constituents. On the other hand, lower substrate temperatures, i.e. below about 1000° C., less germanium is desorbed from the substrate and the operable niobium to germanium impinging composition tends towards about 3 parts of niobium to about 1 part of germanium and lower air incremental pressures are required. With a substrate temperature of 1000° C. and an incremental air pressure of about $2.5 \times 10^{-5}$ mm Hg, a suitable ratio of niobium to germanium is about 2.0 to 2.5 with a total impingement rate of 6 Angstroms per second.

The rate of deposition of the present impinging composition may range from about 0.5 Angstrom per second to about 1200 Angstroms per second. Deposition rates below 0.5 Angstrom per second would require too long a period of time to grow the present film to be practical, whereas rates higher than 1200 Angstroms per second would require high power and provide no significant advantage. For most applications, deposition rates ranging from about 5 Angstroms per second to about 500 Angstroms per second are preferred. The rate at which the present film deposits on the substrate is affected by the same factors affecting film growth, and specific deposition rate is determinable empirically by examining the film formed at a particular niobium/germanium impinging composition, niobium and germanium impingement rates, substrate temperature and incremental air pressure.

The rate of impingement of niobium on the substrate is the same as its deposition rate since niobium is not significantly desorbed from the substrate in the present process. However, since germanium is appreciably desorbed from the substrate, the rate of impingement of germanium flux on the substrate is usually higher than its deposition rate. The particular rate of germanium impingement used will depend upon the particular deposition rate required. Impingement rates of niobium or germanium can be increased by increasing their rates of vaporization from the sources.

The present $Nb_3Ge$ film must be continuous but can vary in thickness. Its particular thickness depends largely on its application. Generally, the present film ranges in thickness from a film which is sufficiently thick to be continuous to one with a thickness of about 5 microns. Films thicker than 5 microns provide no significant advantage. For most computer applications, the thickness of the film ranges from about $\frac{1}{2}$ micron to 3 microns.

The length and the width of the film or its surface area, can be varied, i.e. it can be produced in a number of configurations. The length of the film is limited only by the length of the substrate. The width of the film can range up to several centimeters, usually up to about 10 centimeters.

The present process can be made continuous by providing a vacuum chamber with a suitable inlet and outlet means for a movable or continuously moving substrate which, for example, may be in the form of a tape, which remains within the chamber for a period of time sufficient to deposit the present film thereon. In such instance there is no maximum limitation on the length of the present film.

The present film is of nominal $Nb_3Ge$ composition by which it is meant that its composition may vary about 2 atomic % from its stoichiometric composition. In addition, the present film is polycrystalline with a fine grain size usually less than one micron. It has a $T_c$ of at least 19° K. and usually higher than 19° K., preferably it has a $T_c$ ranging from 19° K. up to about 19.9° K., and still more preferably it has a $T_c$ higher than 20° K. The present film has a transition width less than one degree Kelvin.

If desired, the present film can be removed from the substrate by a number of techniques, such as, for example, by etching away the substrate. In such instances, the film should be thick enough to be self-supporting, i.e. it should be at least about 1 micron in thickness.

The present film, either in self-supporting form or in its form as-deposited on a substrate is useful in computers. In its as-deposited form on a flexible tape it is useful as a conducting member for other uses such as superconducting magnets.

The invention is further illustrated by the following example where a number of runs were carried out in substantially the same manner except is noted.

EXAMPLE

The apparatus used in this example was substantially the same as set forth in FIG. 1. Each substrate was sapphire, 0.025 inch thick, about $1\frac{1}{2}$ inch long and $\frac{3}{4}$ inch wide. Each substrate had a smooth surface polished to 1 $\mu$-in. finish for deposition of the film. Each substrate was clamped to a 6 mm thick Mo plate that was heated on the back side by sheathed Ni-Cr wire. The temperature of each substrate was measured by a thermocouple embedded in the center of the Mo plate. 3 layers of radiation shielding with a narrow window for the deposition area, about 0.8 cm wide and 3 cm long of the smooth polished surface, were utilized.

A movable shutter operable by remote control was positioned to protect the deposition area of the substrate from impingement by niobium and germanium.

Niobium metal and germanium metal were used as sources of niobium and germanium. Each was placed as closely perpendicular to the substrate deposition area as possible about 25 cms from the substrate, and close together separated by partitioning means which prevented germanium flux from striking the monitor for niobium and which prevented niobium flux from striking the monitor for germanium.

The niobium metal was contained in a water cooled copper crucible and was heated by an electron gun. The germanium metal was contained in a ceramic coated tungsten wire basket and was heated by passing an electrical current through the tungsten wire basket.

Rate monitors of oscillating quartz crystal type were used to measure the evaporation rates. These gave rate values with approximately ±5% accuracy. Impinging flux composition was controlled by changing the impingement rates to the substrates by changing the evaporation rate.

From a series of earlier runs wherein the same apparatus conditions were used, data was produced for given periods of time for particular rates of evaporation which produced elemental films of Nb or Ge of particular thickness which allowed graphs to be plotted, i.e. evaporation rates vs. rate monitor readings and from these graphs an impingement rate for Nb or Ge could be determined for particular rates of evaporation.

After the vacuum chamber was pumped down to a residual pressure of $1 \times 10^{-5}$ mm Hg, the substrate was heated to a temperature of 1000° C. and maintained at such temperature during the entire deposition process.

Niobium and germanium were then heated to a vaporizing temperature.

The strong gettering ability of evaporating Nb typically dropped the system pressure from $10^{-5}$ to $10^{-6}$ and $10^{-7}$ mm Hg during the pre-deposition period. When the desired Nb/Ge impinging flux ratio of about 2.5 ±10% was attained using a total impingement rate of about 6 Angstroms per second and the resulting residual pressure stabilized, air was bled into the chamber and when the total pressure in the chamber stabilized at the values indicated in FIG. 2, the shutter was removed from the deposition area of the substrate to allow impingement thereon of niobium and germanium flux.

Each run ranged from about 500 to 600 seconds. At the end of each run, the shutter was positioned to protect the substrate deposition area, the air was turned off and heat to the substrate, Nb and Ge was turned off and the substrate was cooled, usually to about 150° C., at which point the vacuum pump was turned off and the system was vented with nitrogen gas.

Each film deposited on the substrate was examined and found to be continuous and highly adherent to the substrate.

The critical temperature, $T_c$, of each deposited film was uniform throughout the film within ±0.1° K. and was determined by measuring its resistance with a 4-point probe in a double wall cryostat that was cooled with liquid helium.

Figure 2:
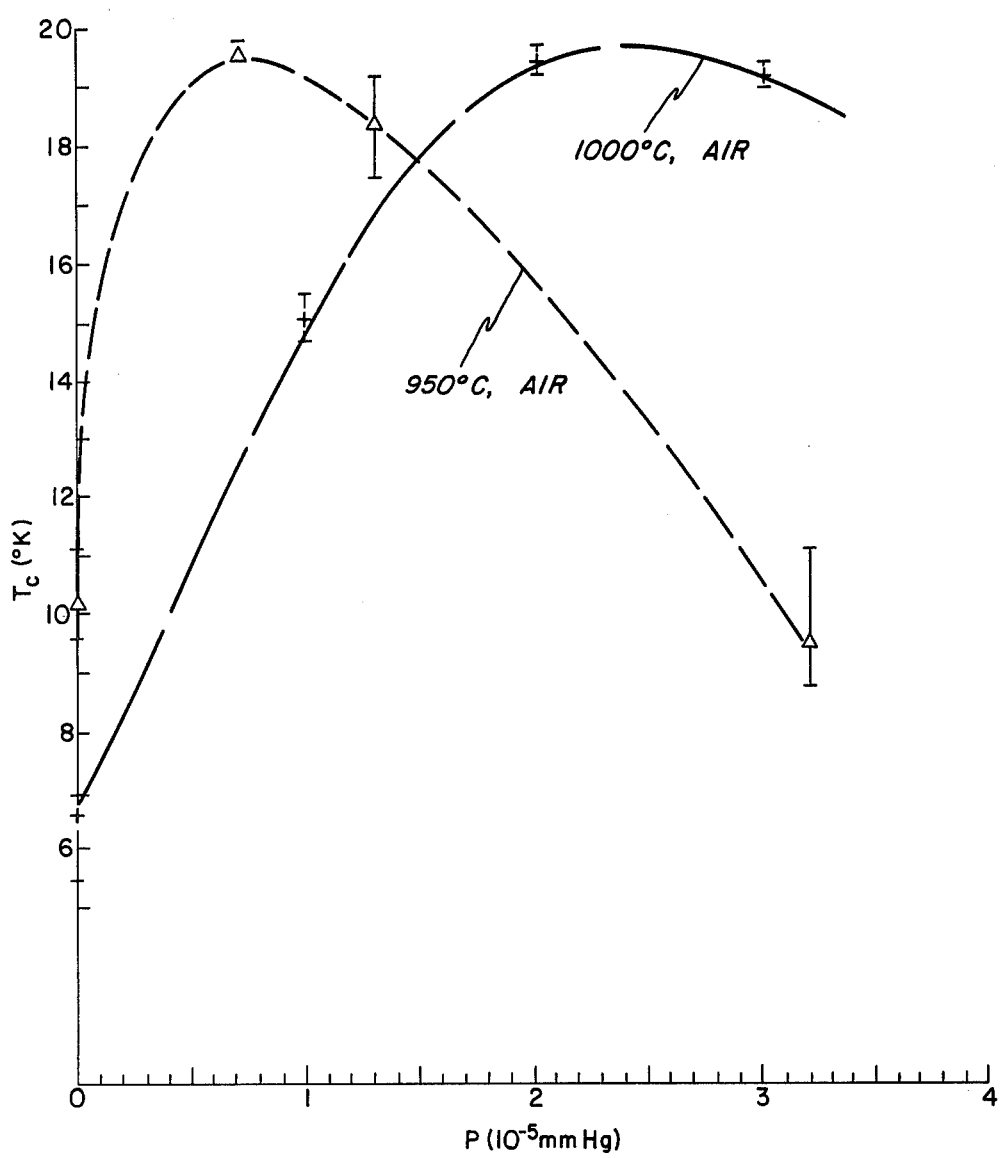
FIG. 2 is a graphic illustration of the critical temperature, $T_c$, vs. incremental increases in pressure made by bleeding in air into the evacuated chamber for a substrate temperature of 950° C. and 1000° C.

In FIG. 2, the critical temperature $T_c$ point plotted is the temperature at which the film became 50% superconducting in that it had one half of its normal conductor resistance which existed at three degrees Kelvin above $T_c$.

Each vertical bar indicates transition width and ranges from when the film became 10% superconducting in that it had 90% of its normal conductor resistance which existed at three degrees Kelvin above $T_c$ to the temperature in degrees Kelvin at which the film became 90% superconducting in that it had 10% of its normal conductor resistance which existed at three degrees Kelvin above $T_c$.

The results are shown in FIG. 2 which displays the effects of air levels.

FIG. 2 shows that without air at substrate temperatures of 950° C. and 1000° C., films are produced with low critical temperatures, i.e. a $T_c$ of about 10° K. and about 7° K. Also, FIG. 2 shows that the runs which used air but which produced films with a $T_c$ below 19° K. utilized an incremental air pressure which was either too high or too low for the conditions used here, i.e. substrate temperature and impingement rates.

X-ray diffraction data indicate the presence of single phase $Nb_3Ge$ in the high $T_c$ films.

The following cited copending patent applications filed of even date herewith in the name of Raymond A. Sigsbee and assigned to the assignee hereof are, by reference, made part of the disclosure of the present application:

In copending U.S. patent application, Ser. No. 816,481 entitled "$Nb_3Ge$ Semiconductive Films", there is disclosed a superconductive film of $Nb_3Ge$ with a critical temperature $T_c$ of at least 20° K. produced by providing within a vacuum chamber a heated substrate and sources of niobium and germanium, reducing the pressure within the chamber to a residual pressure no greater than about $10^{-5}$ mm Hg, introducing oxygen into the resulting evacuated chamber in controlled amounts and vaporizing the niobium and germanium to deposit a film of $Nb_3Ge$ on the heated substrate.

In copending U.S. patent application, Ser. No. 816,483 entitled "$Nb_3Ge$ Superconductive Films Grown With Nitrogen", there is disclosed a superconductive film of $Nb_3Ge$ with a critical temperature of $T_c$ of at least 17.5° K. produced by providing within a vacuum chamber a heated substrate and sources of niobium and germanium, reducing the pressure within the chamber to a residual pressure no greater than about $10^{-5}$ mm Hg, introducing nitrogen into the resulting evacuated chamber in controlled amounts and vaporizing the niobium and germanium to deposit a film of $Nb_3Ge$ on the heated substrate.

What is claimed is:

1. A superconductive continuous film of $Nb_3Ge$ having a surface area of at least one square centimeter ranging in composition up to about 2 atomic % from stoichiometric composition having a critical temperature $T_c$ of at least about 19 degrees Kelvin, said critical temperature $T_c$ being the temperature at which said film becomes 50% superconducting in that it has one half of its normal conductor resistance existing at three degrees Kelvin above $T_c$, said film having a transition width of less than one degree Kelvin extending from the temperature in degrees Kelvin at which said film becomes 10% superconducting in that it has 90% of its normal resistance existing at three degrees Kelvin above $T_c$ to the temperature in degrees Kelvin at which said film becomes 90% superconducting in that it has 10% of its normal conductor resistance existing at three degrees Kelvin above $T_c$.

2. A superconducting film according to claim 1 wherein said critical temperature $T_c$ ranges from about 19° K. to 19.9° K.

3. A superconductive film according to claim 1 wherein said film ranges in width up to about 10 centimeters and wherein there is no maximum limit on its length.

4. A superconductive film according to claim 1 which is self-supporting.

5. A superconductive film according to claim 1 which is adherently supported by a substrate.

6. A superconductive film according to claim 1 wherein the substrate is in the form of a tape.

* * * * *